United States Patent
Kumamoto et al.

(10) Patent No.: US 7,329,562 B2
(45) Date of Patent: Feb. 12, 2008

(54) PROCESS OF PRODUCING SEMICONDUCTOR CHIP WITH SURFACE INTERCONNECTION AT BUMP

(75) Inventors: Nobuhisa Kumamoto, Kyoto (JP); Katsumi Samejima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/767,439

(22) Filed: Jan. 30, 2004

(65) Prior Publication Data

US 2004/0183208 A1    Sep. 23, 2004

Related U.S. Application Data

(62) Division of application No. 09/504,874, filed on Feb. 16, 2000, now Pat. No. 6,707,159.

(30) Foreign Application Priority Data

Feb. 18, 1999  (JP) .................... 11-040399
Feb. 23, 1999  (JP) .................... 11-045211

(51) Int. Cl.
*H01L 21/44*   (2006.01)
*H01L 21/48*   (2006.01)
*H01L 21/50*   (2006.01)

(52) U.S. Cl. ............... 438/108; 438/109; 257/E21.508
(58) Field of Classification Search ............... 438/108, 438/109, 613, 614; 257/737, 738
See application file for complete search history.

(56) References Cited

U.S. PATENT DOCUMENTS

| | | | | |
|---|---|---|---|---|
| 5,604,379 | A | * | 2/1997 | Mori ......................... 257/738 |
| 5,949,135 | A | * | 9/1999 | Washida et al. ............ 257/685 |
| 6,232,666 | B1 | * | 5/2001 | Corisis et al. ............. 257/774 |
| 6,255,737 | B1 | * | 7/2001 | Hashimoto .................. 257/784 |

FOREIGN PATENT DOCUMENTS

| | | |
|---|---|---|
| EP | 0812 238 | 12/1997 |
| EP | 0813 238 | 12/1997 |
| JP | 63-216994 | 9/1988 |
| JP | 4-99537 | 8/1992 |
| JP | 4-278542 | 10/1992 |
| JP | 7-42134 | 7/1995 |
| JP | 08-340029 | 12/1996 |
| JP | 9-330934 | 12/1997 |
| JP | 10-313074 | 11/1998 |

* cited by examiner

*Primary Examiner*—Phat X Cao
(74) *Attorney, Agent, or Firm*—Rabin & Berdo, PC

(57) ABSTRACT

A semiconductor chip including a bump projecting from a surface protective film thereof and a surface interconnection having a smaller height than the bump. The surface interconnection may project from the surface protective film or may be flush with the surface protective film. The surface interconnection may be connected to the bump. The bump may include a peripheral bump configured as surrounding a device formation region of the chip. The peripheral bump may be connected to the ground or a power source.

16 Claims, 12 Drawing Sheets

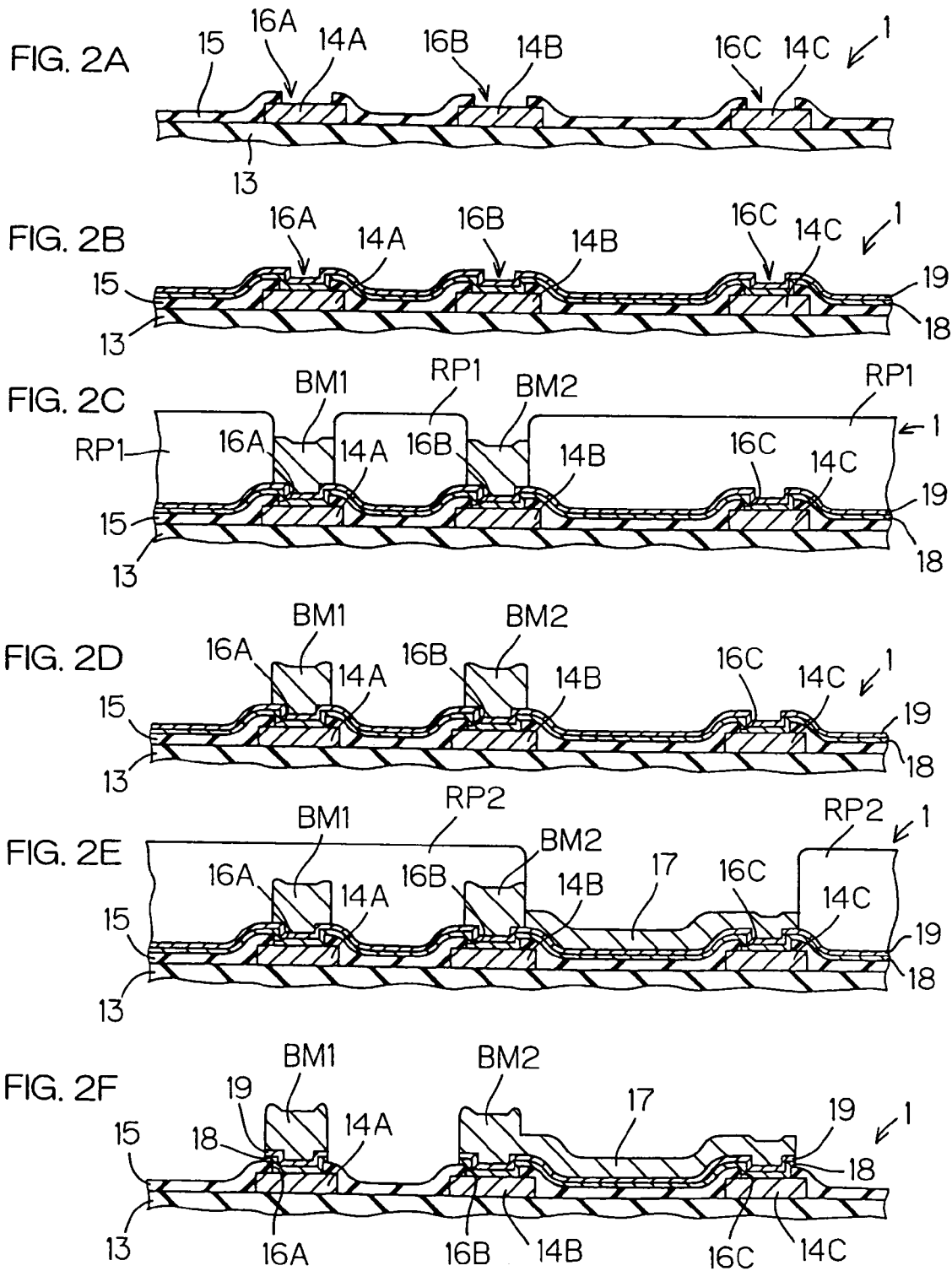

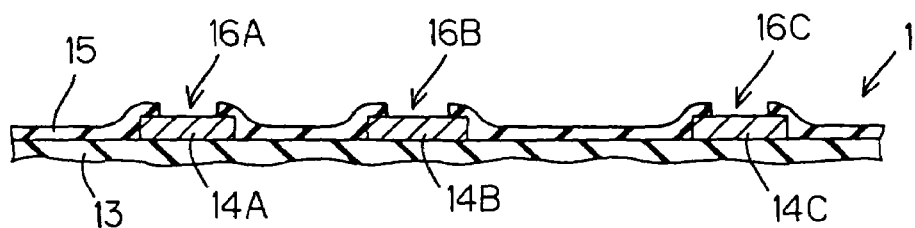
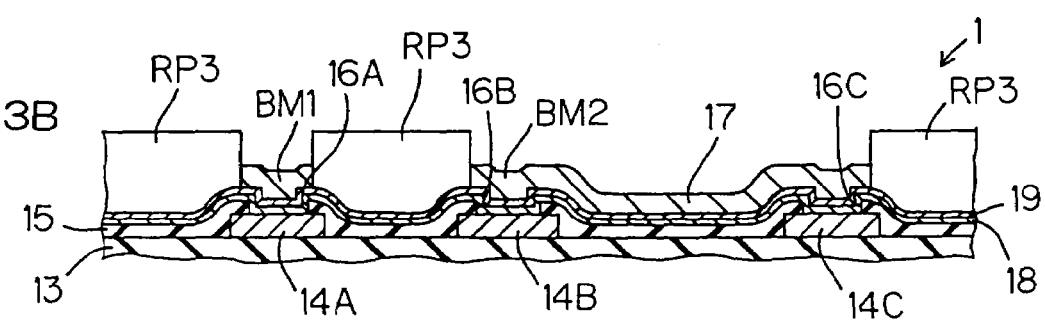
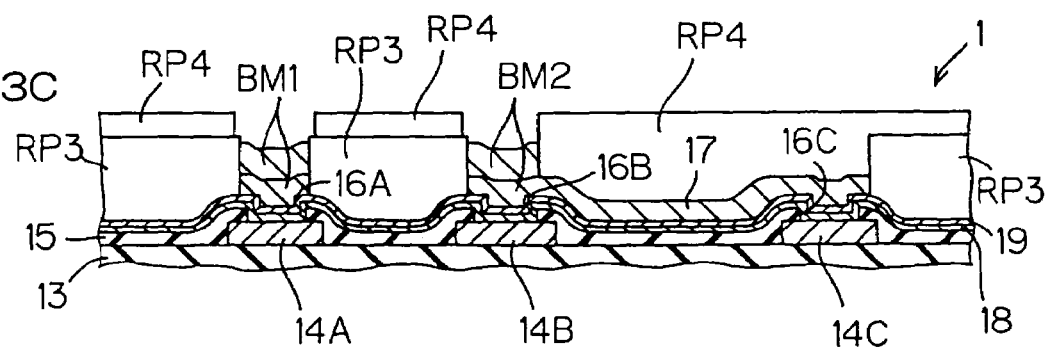
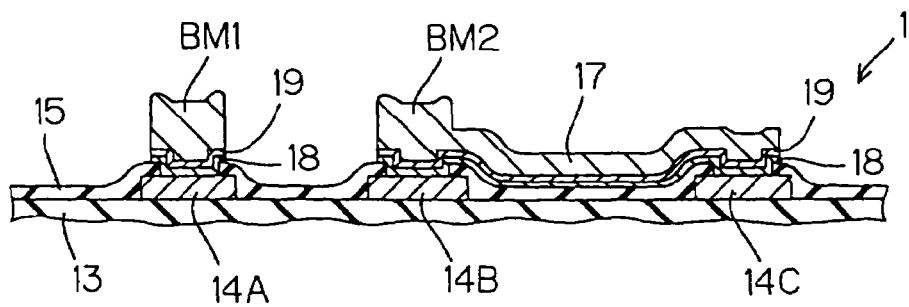

PROCESS OF PRODUCING SEMICONDUCTOR CHIP WITH SURFACE INTERCONNECTION AT BUMP

This is a Divisional of U.S. application Ser. No. 09/504,874, filed Feb. 16, 2000 now U.S. Pat. No. 6,707,159.

BACKGROUND OF THE INVENTION

1. Field of the Invention

The present invention relates to a semiconductor chip which is applicable, for example, to a chip-on-chip structure in which semiconductor chips are bonded to each other in a stacked relation and to a flip-chip-bonded structure in which a semiconductor chip is bonded to a printed wiring board with its face opposed to the printed wiring board. The invention further relates to a production process for such a semiconductor chip.

2. Description of Related Art

For size reduction and higher integration of a semiconductor device, a so-called chip-on-chip structure has been proposed in which a pair of semiconductor chips are disposed in an opposed relation and electrically connected to, each other via bumps.

Further, a wireless bonding technique has been used, by which electrodes provided on a device formation surface of a semiconductor chip are directly connected to electrodes on a wiring substrate such as of a carrier tape, and the electrodes on the wiring substrate are connected to a printed board or a ceramic board.

In either of the aforesaid techniques, it is necessary to provide electrode projections generally called "bumps" on the electrodes of the wiring substrate or on the device formation surface of the semiconductor chip.

On the other hand, a multiplicity of internal interconnections are provided in the device formation surface of the semiconductor chip to fulfill functions of the chip and, therefore, the chip should be designed so as not to complicate the routing of these interconnections.

However, there is a limit to the routing of the interconnections within the limited device formation surface, thereby hindering the size reduction and higher integration of the chip.

SUMMARY OF THE INVENTION

For implementation of a semiconductor device of chip-on-chip structure, the inventors of the present invention have come up with an idea that a surface interconnection composed of the same oxidation-resistant material as a bump is provided on a surface of each of opposed semiconductor chips. Where the surface interconnection is connected to the bump, for example, electrical connection between the opposed semiconductor chips can be achieved by bonding the surface interconnection of one of the semiconductor chips to the bump of the other semiconductor chip. This increases flexibility in layout of the bump on the other semiconductor chip. Further, an increased number of interconnections can be provided by connecting internal interconnections via the surface interconnection without increasing the thickness of the semiconductor chip.

Referring to FIG. 13, where surface interconnections 81 and 91 are respectively provided on opposed surfaces of semiconductor chips 80 and 90, however, there is a possibility that the surface interconnections 81, 91 of the semiconductor chips 80, 90 are brought into contact with each other, resulting in unintended electrical connection between the semiconductor chips 80 and 90.

Besides the chip-on-chip structure, the so-called flip-chip-bonded structure in which a semiconductor chip is bonded to a printed wiring board with their surfaces opposed to each other may also suffer from this problem when a surface interconnection is provided on the surface of the semiconductor chip.

In view of the foregoing, it is an object of the present invention to provide a semiconductor chip which is free from unintended electrical connection to the other semiconductor chip and features an increased flexibility in routing of interconnections with the use of a surface interconnection for size reduction and higher integration thereof, and to provide a production process for such a semiconductor chip.

The semiconductor chip according to the present invention comprises: a bump projecting from a surface protective film thereof for electrical connection between the semiconductor chip and another device; and a surface interconnection provided on the surface protective film and having a smaller height than the bump.

With this arrangement, the surface interconnection can be used in place of part of an internal interconnection in the chip, thereby simplifying the routing of internal interconnections. Further, the surface interconnection can have a lower resistance and a higher heat conductivity so as to carry a relatively large electric current. Thus, the surface interconnection can advantageously be used, for example, as a grounding line or as a power supply line.

The semiconductor chip may be bonded, for example, onto a surface of a solid body. In this case, the surface protective film covers a surface of the semiconductor chip which is opposed to the surface of the solid body, and the bump may serve for electrical connection to the solid body.

The surface of the solid body may be a surface of another semiconductor chip or a surface of a wiring board.

With this arrangement, the surface interconnection provided on the surface protective film has a smaller height than the bump projecting from the surface protective film. Therefore, there is no possibility that, when the semiconductor chip and the solid body (i.e., another semiconductor chip or the like) are bonded to each other in an opposed relation, the surface interconnection of the semiconductor chip is brought into contact with a surface interconnection and the like provided on the opposed surface of the solid body, thereby eliminating the possibility of unintended electrical connection between the semiconductor chip and the solid body via the surface interconnections.

The surface interconnection may project from the surface protective film or may be flush with the surface protective film.

The surface interconnection may be connected to the bump. For example, inter-bump interconnection can be achieved via the surface interconnection.

The bump may include a peripheral bump which is provided outside a device formation region of a semiconductor substrate which is a base of the semiconductor chip. In this case, the peripheral bump is preferably configured as surrounding the device formation region. More specifically, the peripheral bump may be provided in a scribe line region.

The surface interconnection may be connected to the peripheral bump. In this case, the peripheral bump is preferably to be connected to the ground or a power source.

The production process for the semiconductor chip in accordance with the present invention comprises the steps of: providing an internal interconnection on a semiconductor substrate; forming a surface protective film over the internal interconnection; forming an opening in the surface protective film to expose a portion (electrode) of the internal interconnection; forming a bump projecting from the surface protective film on the portion of the internal interconnection exposed through the opening; and forming a surface interconnection having a smaller height than the bump in a predetermined region on the surface protective film except a portion thereof formed with the opening.

By this process, the surface interconnection having a smaller height than the bump can be formed on the surface protective film.

The bump forming step may comprise the step of selectively depositing a conductive material on the portion of the internal interconnection exposed through the opening. The surface interconnection forming step may comprise the step of selectively depositing the conductive material in the predetermined region on the surface protective film except the portion thereof formed with the opening.

The formation of the bump and the surface interconnection may be achieved by selectively depositing the conductive material on the portion of the internal interconnection exposed through the opening and in the predetermined region on the surface protective film except the portion thereof formed with the opening to form a part of the bump and the surface interconnection, and further selectively depositing the conductive material on the part of the bump to complete the bump which projects from the surface protective film.

The process may further comprise the step of forming a recess in a region of the surface protective film on which the surface interconnection is to be formed before the formation of the bump and the surface interconnection, wherein the surface interconnection is formed in the recess.

In this case, the formation of the bump and the surface interconnection may be achieved by selectively depositing the conductive material in the opening and the recess for the formation of a part of the bump and the surface interconnection, and further selectively depositing the conductive material on the part of the bump for the completion of the bump which projects from the surface protective film.

The selective deposition of the conductive material in the opening and the recess may comprise the steps of: forming a conductive material film over the surface protective film formed with the opening and the recess; and removing the conductive material film except portions thereof formed in the opening and the recess.

In this case, the removal of the conductive material film may be achieved by polishing away the conductive material film except the portions thereof formed in the opening and the recess for planarization thereof. The conductive material film except the portions thereof formed in the opening and the recess may entirely or partly be removed in the planarization step.

The recess may have a bottom surface located at a lower level than a top surface of the internal interconnection. Thus, the surface interconnection formed on the surface protective film has a height which is smaller than the height of the bump by a level difference between the top surface of the internal interconnection and the bottom surface of the recess.

The process may further comprise the step of planarizing the surface of the surface protective film between the step of forming the surface protective film and the step of forming the opening and the recess. The planarization of the surface of the surface protective film prior to the formation of the opening and the recess in the surface protective film, for example, eliminates the possibility of de-focusing in exposure in the photolithography process when the opening and the recess are formed in the surface protective film. This allows for precise formation of the opening and the recess, so that the bump and the surface interconnection can be formed in exact positions.

The foregoing and other objects, features and effects of the present invention will become more apparent from the following description of the preferred embodiments with reference to the attached drawings.

BRIEF DESCRIPTION OF THE DRAWINGS

FIGS. 2A to 2F are sectional views illustrating the construction of a subsurface portion of the semiconductor chip and a production process for the semiconductor chip;

FIGS. 3A to 3D are sectional views illustrating the sequence of steps of another production process for the semiconductor chip;

DESCRIPTION OF THE PREFERRED EMBODIMENTS

Figure 1:
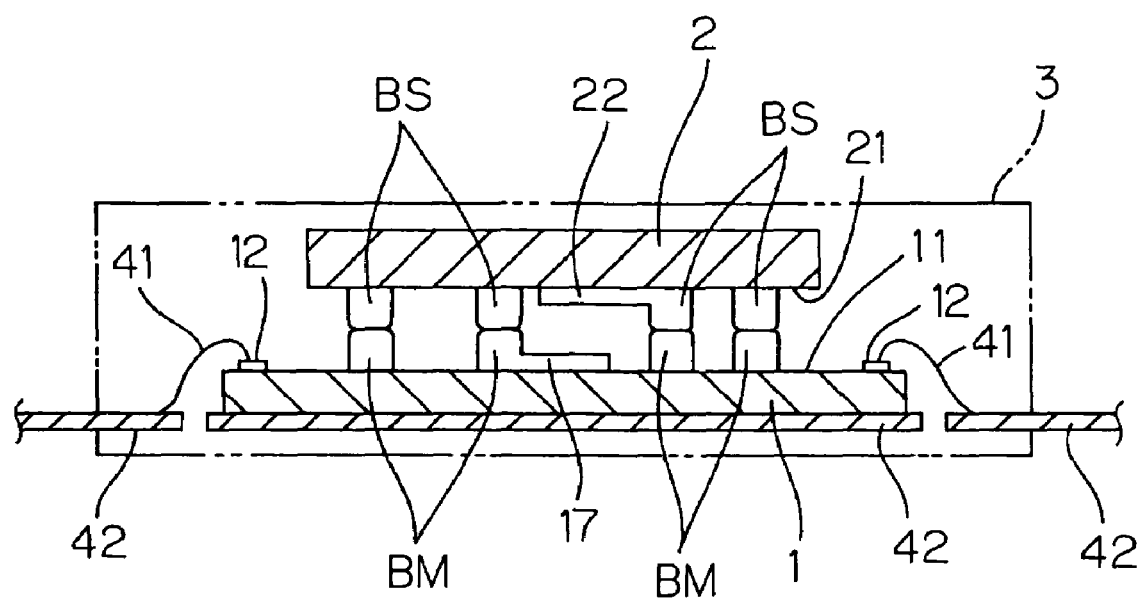
FIG. 1 is a sectional view schematically illustrating the construction of a semiconductor device to which a semiconductor chip according to one embodiment of the present invention is applied.

FIG. 1 is a sectional view schematically illustrating the construction of a semiconductor device to which a semiconductor chip according to one embodiment of the present invention is applied. The semiconductor device has a so-called chip-on-chip structure, and is constructed by bonding a secondary chip 2 on a surface 11 of a primary chip 1 in a stacked relation and packaging these chips in a package 3.

The primary chip 1 is comprised, for example, of a silicon chip. The surface 11 of the, primary chip 1 is a semiconductor substrate surface of the primary chip 1 on the side of an active surface region formed with a functional device such as a transistor, and covered with a surface protective film having an insulative property. A plurality of pads 12 for external connection are provided, as exposed from the surface protective film, in a peripheral portion of the surface 11. The external connection pads 12 are connected to a lead frame 42 via bonding wires 41. A plurality of bumps BM electrically connected to internal interconnections are provided on the surface protective film.

The secondary chip 2 is comprised, for example, of a silicon chip. The secondary chip 2 has a surface 21 which is a semiconductor substrate surface thereof on the side of an active surface region formed with a functional device such as a transistor, and covered with a surface protective film having an insulative property. A plurality of bumps BS connected to internal interconnections are provided on the surface protective film.

The secondary chip 2 is bonded to the primary chip 1 with its surface 21 opposed to the surface 11 of the primary chip 1 by a so-called face-down bonding. The bumps BS of the secondary chip 2 which are provided in association with the bumps BM of the primary chip 1 are connected to the corresponding bumps BM of the primary chip 1, whereby the secondary chip 2 is supported above the primary chip 1 and electrically connected to the primary chip 1.

FIGS. 2A to 2F are sectional views illustrating the construction of a subsurface portion of the primary chip 1 and a production process therefor. Referring to FIG. 2F, an inter-level insulating film 13 such as of silicon oxide is provided on a semiconductor substrate (no shown) which serves as a base body of the primary chip 1. Internal interconnections 14A, 14B, 14C are provided on the inter-level insulating film 13. The inter-level insulating film 13 and the internal interconnections 14A, 14B, 14C are covered with a surface protective film 15 such as of silicon nitride. The surface protective film 15 is formed with openings 16A, 16B and 16C, which face the internal interconnections 14A, 14B and 14C for partly exposing therethrough the internal interconnections 14A, 14B and 14C, respectively.

Bumps BM1 and BM2 are provided on the openings 16A and 16B, respectively, as projecting therefrom. The bumps BM1, BM2 are composed of an oxidation-resistant material such as gold, platinum, silver, palladium or iridium, and have substantially the same height. The bump BM2 is connected to one end of a surface interconnection 17 provided on the surface protective film 15. The other end of the surface interconnection 17 is connected to the internal interconnection 14C via the opening 16C. That is, the internal interconnections 14B, 14C are electrically connected to each other via the bump BM2 and the surface interconnection 17. The surface interconnection 17 is composed of the same material as the bumps BM1, BM2, and has a smaller height than the bumps BM1, BM2.

For formation of the bumps BM1, BM2 and the surface interconnection 17, the openings 16A, 16B, 16C are first formed in the surface protective film 15, as shown in FIG. 2A, by the photolithography technique. Then, a barrier metal film 18 and a seed film 19 are formed over the surface protective film 15 formed with the openings 16A, 16B, 16C, as shown in FIG. 2B, by sputtering. The barrier metal film 18 serves to prevent a metal contained in the seed film 19 from diffusing into the surface protective film 15. Where the bumps BM1, BM2 are composed of gold, for example, the barrier metal film 18 and the seed film 19 are preferably composed of titanium tungsten and gold, respectively.

In turn, as shown in FIG. 2C, a resist pattern RP1 is formed on the seed film 19 except regions thereof on which the bumps BM1, BM2 are to be formed or which face the openings 16A, 16B, and then the resulting surface is subjected to electroplating with the use of the material for the bumps BM1, BM2. Thus, the plating material is deposited only on the regions of the seed film 19 exposed from the resist pattern RP1, i.e., on the regions thereof which face the openings 16A, 16B, whereby the bumps BM1, BM2 are formed on the openings 16A, 16B.

Subsequently, as shown in FIG. 2D, the resist pattern RP1 on the seed film 19 is removed. As shown in FIG. 2E, another resist pattern RP2 is formed on the seed film 19 except a region thereof on which the surface interconnection 17 is to be formed, and then the resulting surface is subjected to electroplating with the use of the material for the surface interconnection 17. Thus, the plating material is deposited on the region of the seed film 19 exposed from the resist pattern RP2. As a result, the surface interconnection 17 is formed on the seed film 19 with one end thereof being connected to the bump BM2 and with the other end thereof being connected to the internal interconnection 14C via the opening 16C. A plating period for the formation of the surface interconnection 17 is set shorter than a plating period for the formation of the bumps BM1, BM2.

After the resist pattern RP2 on the seed film 19 is removed, an unnecessary portion of the seed film 19 which contact neither the bumps BM1, BM2 nor the surface interconnection 17 is etched away. Further, a portion of the barrier metal film 18 exposed as a result of the removal of the seed film 19 is etched away. Thus, the bumps BM1, BM2 projecting on the openings 16A, 16B and the surface interconnection 17 having a smaller height than the bumps BM1, BM2 are provided (see FIG. 2F).

In accordance with this embodiment, the bumps BM (BM1, BM2) for electrical connection to the secondary chip 2 and the surface interconnection 17 electrically connecting the internal interconnections 14B and 14C to each other are provided on the surface of the primary chip 1, and the surface interconnection 17 has a smaller height than the bumps BM. Therefore, there is no possibility that the bumps BS provided on the surface of the secondary chip 2 contact the surface interconnection 17 of the primary chip 1, thereby eliminating the possibility of unintended electrical connection between the primary chip 1 and the secondary chip 2.

Although an explanation has thus been given mainly to the construction of the primary chip 1, the secondary chip 2 may also include a surface interconnection 22 provided on the surface thereof as shown in FIG. 1. In this case, the surface interconnection 22 of the secondary chip 2 preferably has a smaller height than the bumps BS like the surface interconnection 17 of the primary chip 1. Thus, the bumps BM of the primary chip 1 are prevented from contacting the surface interconnection 22 of the secondary chip 2, so that unintended electrical connection between the primary chip 1 and the secondary chip 2 is prevented.

FIGS. 3A to 3D are sectional views illustrating the sequence of steps of another process for the formation of the bumps BM and the surface interconnection 17. In FIGS. 3A to 3D, components corresponding to those illustrated in FIGS. 2A to 2F are denoted by the same reference characters as in FIGS. 2A to 2F. However, it is not intended that the components denoted by the same reference characters necessarily have completely the same construction. This comment is similarly applied to description of the other embodiments.

Although the formation of the bumps BM1, BM2 precedes the formation of the surface interconnection 17 in the production process shown in FIGS. 2A to 2F, the bumps BM1, BM2 are formed after the formation of the surface interconnection 17 in the production process shown in FIGS. 3A to 3D.

More specifically, the openings 16A, 16B, 16C are first formed in the surface protective film 15, as shown in FIG.

3A, by the photolithography technique. Then, the barrier metal film 18 and the seed film 19 are formed on the surface protective film 15 formed with the openings 16A, 16B, 16C, as shown in FIG. 3B, by sputtering. After a resist pattern RP3 is formed on the seed film 19 except regions thereof on which the bumps BM1, BM2 are to be formed and a region thereof on which the surface interconnection 17 is to be formed, the resulting surface is subjected to electro plating with the use of the material for the bumps BM1, BM2 and the surface interconnection 17. Thus, the plating material is deposited only on the regions of the seed film 19 exposed from the resist pattern RP3, whereby parts of the bumps BM1, BM2 are formed on the openings 16A, 16B, and the internal interconnection 17 connecting the part of the bump BM2 and the internal interconnection 14C to each other is formed.

Subsequently, as shown in FIG. 3C, an additional resist pattern RP4 is formed on the resulting surface except regions thereof on which the bumps BM1, BM2 are to be formed, i.e., regions thereof which face the openings 16A, 16B, and then the resulting surface is subjected to electroplating with the use of the material for the bumps BM1, BM2. Thus, the plating material is further deposited on the regions above the openings 16A, 16B, whereby the bumps BM1, BM2 are formed as projecting on the openings 16A, 16B to a higher level than the surface interconnection 17.

Thus, the production process shown in FIGS. 3A to 3D can also provide the surface interconnection 17 having a smaller height than the bumps BM1, BM2.

FIGS. 4A to 4D are sectional views illustrating the sequence of steps of further another process for the formation of the bumps BM and the surface interconnection 17. In FIGS. 4A to 4D, components corresponding to those illustrated in FIGS. 2A to 2F are denoted by the same reference characters as in FIGS. 2A to 2F.

Figure 4A:
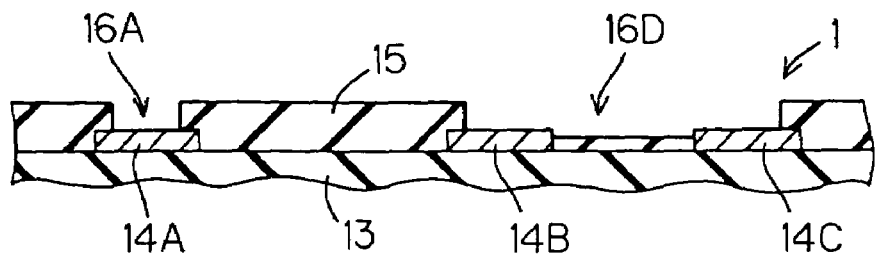
FIGS. 4A to 4D are sectional views illustrating the sequence of steps of further another production process for the semiconductor chip.
Figure 4B:
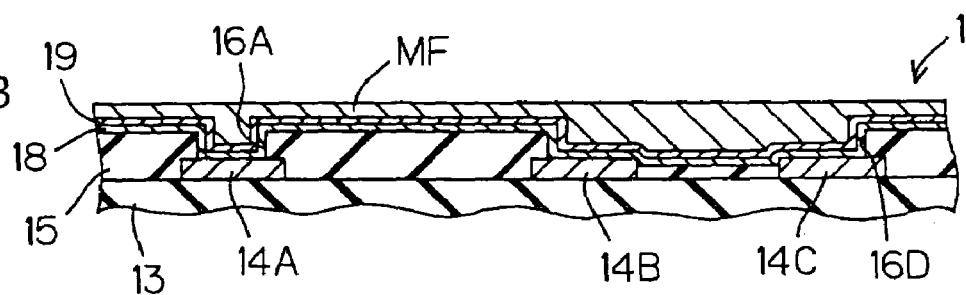
Figure 4C:
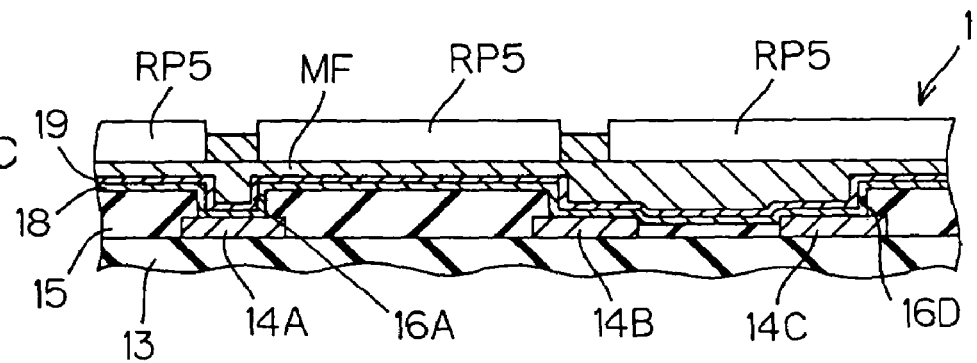
Figure 4D:
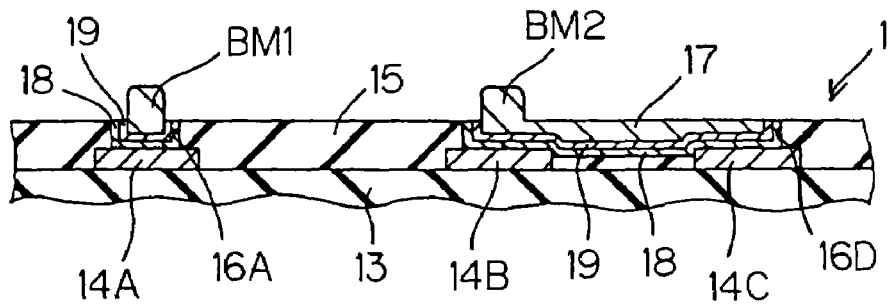

In this production process, as shown in FIG. 4D, the bumps BM1, BM2 are formed as projecting from the internal interconnections 14A, 14B, and the surface interconnection 17 electrically connecting the internal interconnections 14B and 14C to each other are embedded in the surface protective film 15.

More specifically, the surface protective film 15 is first formed over the internal interconnections 14A, 14B, 14C to a thickness greater than the thickness of the internal interconnection 14A. After the resulting surface is subjected to a CMP (chemical mechanical polishing) process for planarization of the surface of the surface protective film 15, an opening 16A and a recess 16D are formed in the surface protective film 15, as shown in FIG. 4A, by the photolithography technique. The opening 16A faces the internal interconnection 14A, and the recess 16D spans between the internal interconnections 14B and 14C. Thus, a portion of the internal interconnection 14A is exposed through the opening 16A, and portions of the internal interconnections 14B, 14C and a portion of the surface protective film 15 between the internal interconnections 14B and 14C are exposed through the recess 16D.

Subsequently, a barrier metal film 18 and a seed film 19 are formed on the surface of the surface protective film 15 formed with the opening 16A and the recess 16D by sputtering. Then, the entire surface of the seed film 19 is subjected to electroplating with the use of the material for the bumps BM1, BM2 and the surface interconnection 17. The plating is continued until the opening 16A and the recess 16D are filled with the plating material. Thus, a metal film MF having a greater thickness than the depths of the opening 16A and the recess 16D is formed on the seed film 19.

Thereafter, the resulting surface is subjected to a CMP process, whereby the surface of the metal film MF formed on the seed film 19 is planarized as shown in FIG. 4B.

In turn, as shown in FIG. 4C, a resist pattern RP5 is formed on the metal film MF except regions thereof on which the bumps BM1, BM2 are to be formed, i.e., regions thereof opposed to the internal interconnections 14A, 14B, and then the resulting surface is subjected to electroplating with the use of the material for the bumps BM1, BM2. Thus, the plating material is deposited only on the regions of the metal film MF exposed from the resist pattern RP5. After the resist pattern RP5 is removed, unnecessary portions of the metal film MF, the seed film 19 and the barrier metal film 18 on the surface protective film 15 are etched away, whereby the bumps BM1, BM2 projecting on the internal interconnections 14A, 14B and the surface interconnection 17 embedded in the surface protective film 15 are provided.

Thus, the production process shown in FIGS. 4A to 4D can also provide the surface interconnection 17 having a smaller height than the bumps BM1, BM2.

Although the resist pattern RP5 is formed on the planarized metal film MF in the production process shown in FIGS. 4A to 4D, the metal film MF except portions thereof formed in the opening 16A and the recess 16D may be removed by the CMP process. In this case, the resist pattern RP5 is formed on an exposed portion of the seed film 19.

Further, the seed film 19 and the barrier metal film 18 except portions thereof formed in the opening 16A and the recess 16D may be removed together with the metal film MF by the CMP process. In this case, the formation of the bumps BM1, BM2 may be achieved by depositing the bump material on the metal film MF remaining in the opening 16A and the recess 16D by selective plating.

Although the internal interconnections 14B and 14C are electrically connected to each other via the surface interconnection 17, the surface interconnection 17 does not necessarily serve for the electrical connection between and the internal interconnections 14B and 14C. For example, the surface interconnection 17 may be connected to diffusion regions such as a source region and a drain region defined in the surface of the semiconductor substrate.

The process for the formation of the surface interconnection 17 having a smaller height than the bumps BM is not limited to those described above, but any other production processes may be employed.

Figure 5:
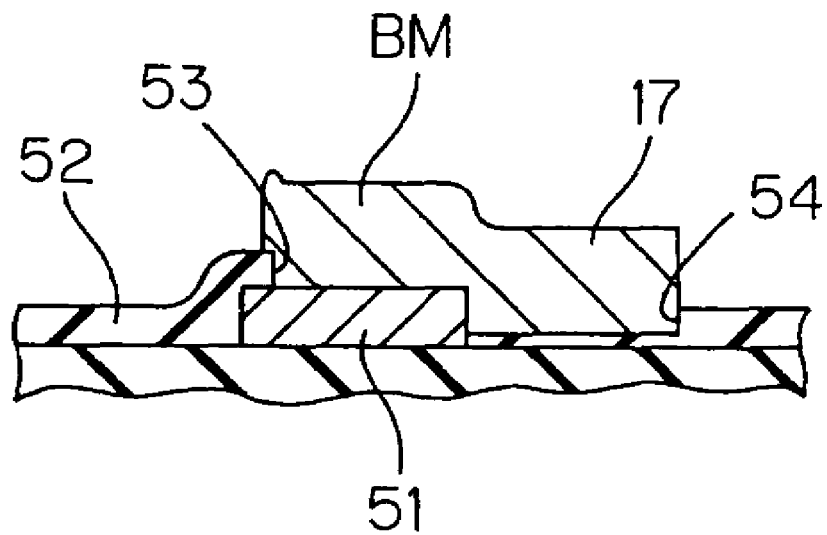
FIG. 5 is a sectional view for explaining still another production process for the semiconductor chip.

For example, a surface protective film 52 is formed over an internal interconnection 51, and then an opening 53 for partly exposing the internal interconnection 51 therethrough and a recess 54 which is continuous to the opening 53 are formed in the surface protective film 52, as shown in FIG. 5. After a resist pattern is formed on the surface protective film 52 except portions thereof formed with the opening 53 and the recess 54, the material for the bump BM and the surface interconnection 17 is deposited in the opening 53 and the recess 54 exposed from the resist pattern by electroplating, whereby the bump BM and the surface interconnection 17 are simultaneously formed. In this case, the surface interconnection 17 thus formed in the recess 54 projects to a level lower than the bump BM on the internal interconnection 51 by a level difference between a top surface of the internal interconnection 51 and a bottom surface of the recess 54.

Figure 6:
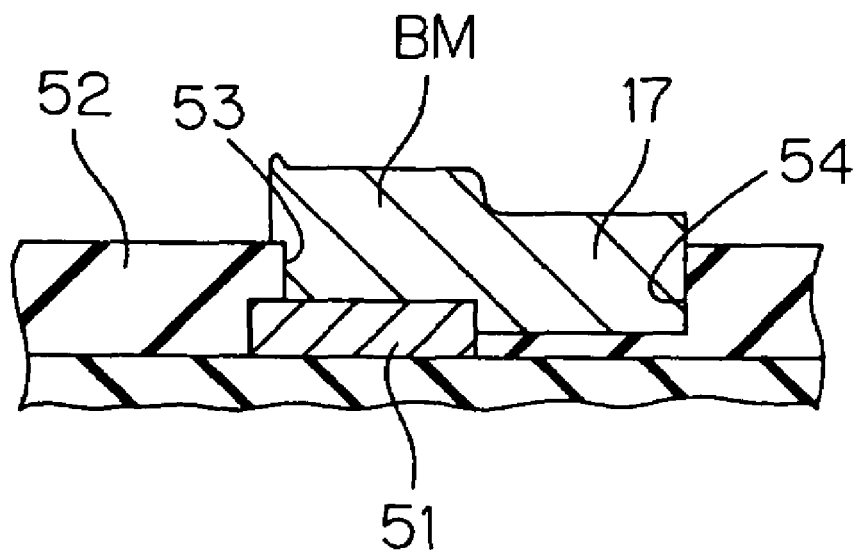
FIG. 6 is a sectional view for explaining a modification of the semiconductor chip production process shown in FIG. 5.

Alternatively, the opening 53 and the recess 54 may be formed after the planarization of the surface protective film 52 on the internal interconnection 51, as shown in FIG. 6. This eliminates the possibility of de-focusing in exposure in the photolithography process when the opening 53 and the recess 54 are formed in the surface protective film 52, and allows for precise formation of the opening 53 and the recess 54. The planarization of the surface protective film 52 may be achieved by forming the surface protective film 52 by a HDP (high density plasma) method or a SOG (spin on glass) method, or by forming the surface protective film 52 by a plasma CVD (chemical vapor deposition) method and then performing a CMP process.

Figure 7:
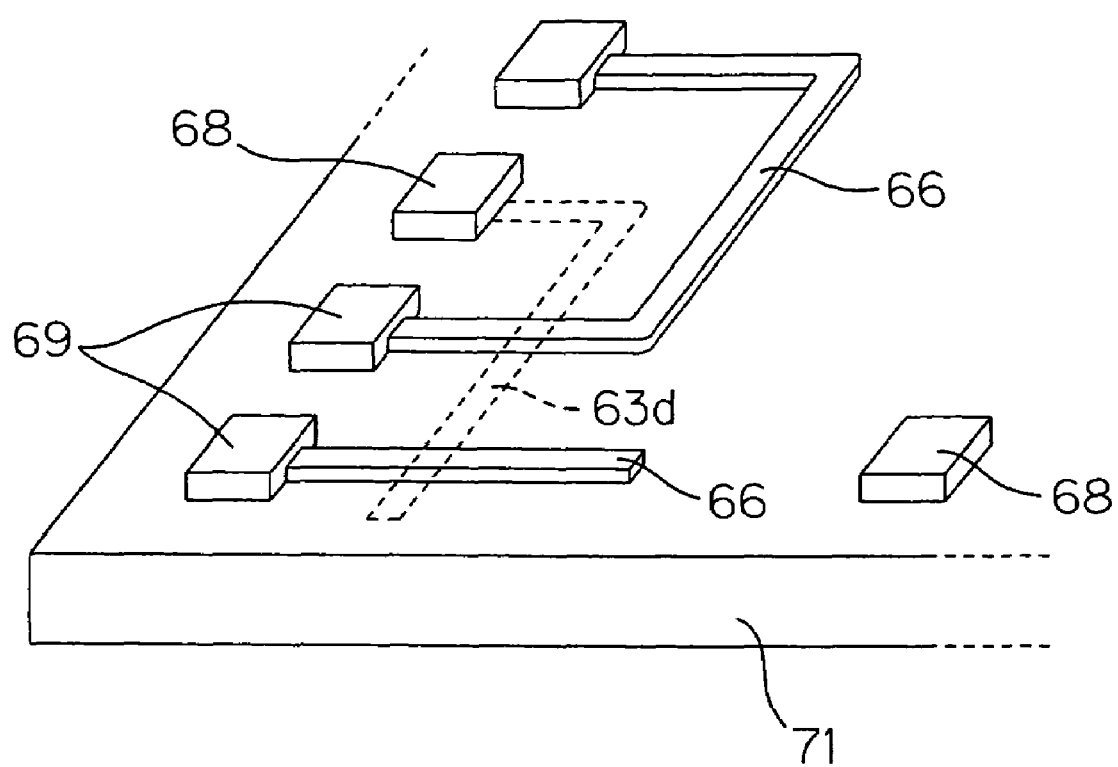
FIG. 7 is a perspective view illustrating major portions of a semiconductor chip according to another embodiment of the invention.

Referring to FIG. 7, an explanation will next be given to a semiconductor chip according to another embodiment of the present invention. The semiconductor chip 71 of this embodiment includes bumps 68, 69 and a surface interconnection 66 provided on an upper surface thereof. The bumps 68, 69 and the surface interconnection 66 project from a surface protective film (passivation film) which covers the outermost surface of the semiconductor chip 71. The bumps 68, 69 serve as external connection terminals of the chip for connection to another chip, a wiring board or an inner lead on a film carrier for TAB (tape automated bonding). On the other hand, the surface interconnection 66 are used for chip internal interconnection.

Figure 8:
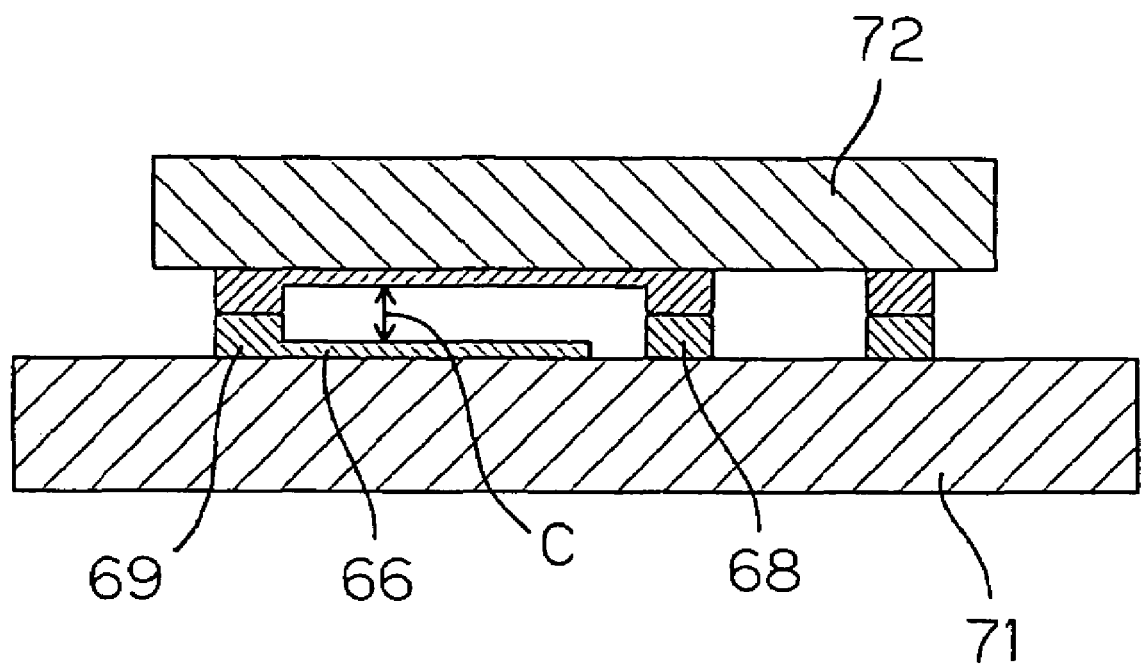
FIG. 8 is a sectional view illustrating a double-chip structure of so-called chip-on-chip type which includes a pair of semiconductor chips.

The surface interconnection 66 has a smaller height than the bumps 68, 69. Where the semiconductor chip 71 is bonded to another semiconductor chip 72 of a similar construction in a face-to-face relation for formation of a double-chip structure as shown in FIG. 8, a predetermined clearance C can be provided between the surface interconnections 66 of the chips 71 and 72. Thus, the surface interconnections of the chips 71, 72 are assuredly prevented from contacting each other in an unintended manner.

FIGS. 9A to 9E are sectional views for explaining a process for forming bumps and a surface interconnection on a semiconductor substrate 61.

Figure 9:
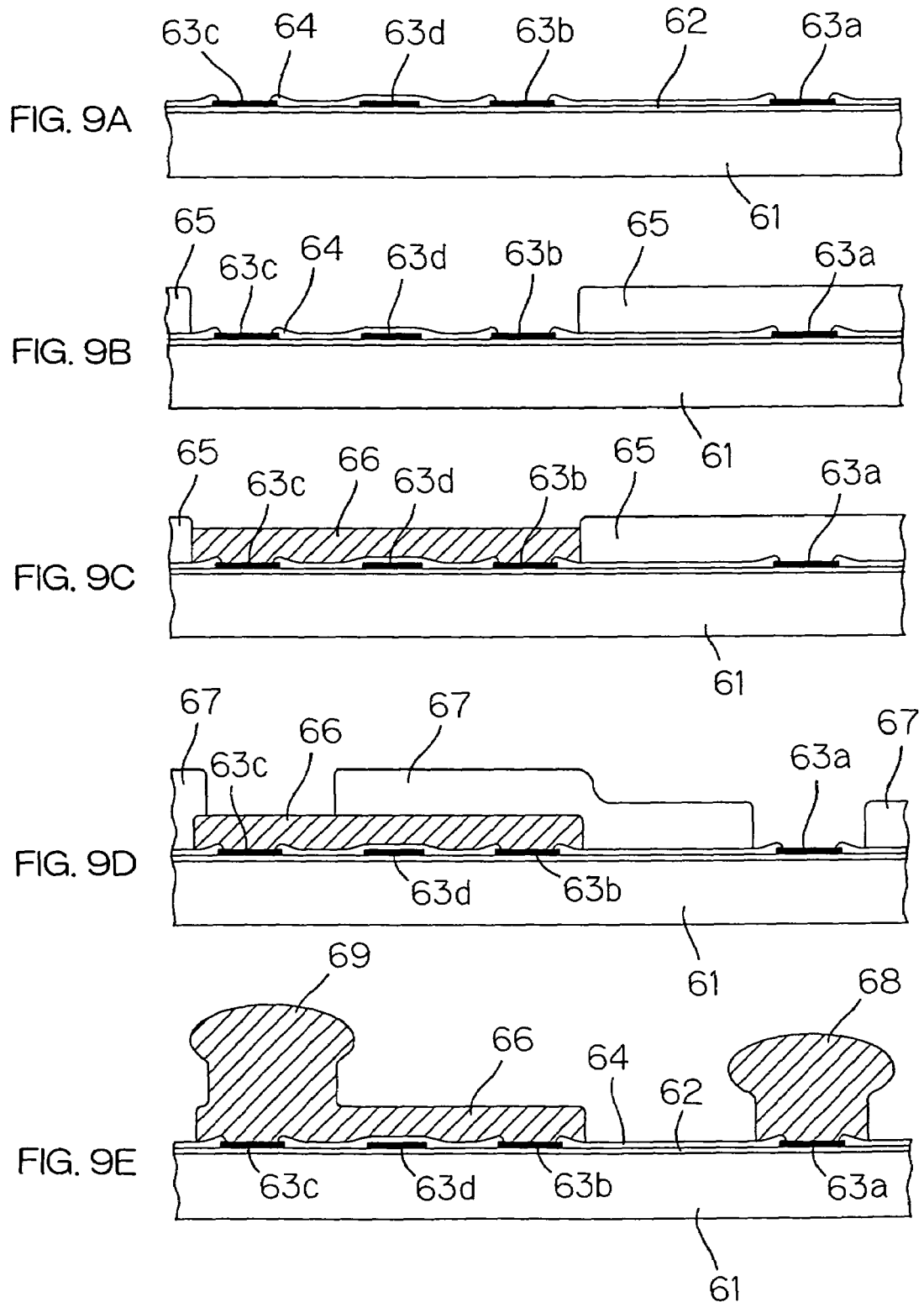
FIGS. 9A to 9E are sectional views for explaining a process for forming a bump interconnection on a semiconductor substrate.

As shown in FIG. 9A, Al electrodes 63a, 63b, 63c, 63d connected to predetermined portions of internal interconnections are formed on the semiconductor substrate 61 with the intervention of an $SiO_2$ film 62. It is herein assumed that bumps are to be formed on the electrodes 63a, 63c, and the electrodes 63b and 63c are to be connected to each other via the surface interconnection. The electrode 63d is to be isolated from the surface interconnection. A surface portion not formed with the electrodes 63a, 63b, 63c is covered with a passivation film 64 such as of SiN, SiON, $SiO_2$ or PSG. The electrode 63d is covered with the passivation film 64. The electrode 63d is isolated from the surface interconnection by the passivation film 64.

A TiW alloy layer (barrier metal layer) for improving adhesion between the Al electrodes and the bumps and a seed film (not shown) such as of Au or Pt for power supply are successively formed on the entire surface of the substrate shown in FIG. 9A by vapor deposition such as sputtering.

In turn, a photoresist 65 is applied on the resulting surface as uncovering a portion thereof on which the surface interconnection is to be formed (FIG. 9B).

Then, the resulting surface is subjected to electroplating with the use of a metal material for the surface interconnection (FIG. 9C). Examples of the metal material for the surface interconnection include oxidation-resistant metals such as Au, Pd, Pt, Ag and Ir (iridium). The surface interconnection thus formed is denoted by a numeral 66. Instead of the electroplating method, an electroless plating method may be employed which is a metal film formation method utilizing a reducing action by a chemical reaction. The surface interconnection 66 has a height of 1 ìm, for example, as measured from the surface of the passivation film 64.

Subsequently, the photoresist 65 is removed, and another photoresist 67 is applied on the resulting surface so as to uncover portions thereof formed with the electrodes 63a, 63c (FIG. 9D).

Then, the resulting surface is subjected to electroplating which utilizes the seed layer, whereby a metal material for the bumps is deposited on the uncovered portions. After the photoresist 67 is removed, an exposed portion of a laminate of the barrier metal layer and the seed layer is removed and then the resulting surface is subjected to an annealing process. Thus, the semiconductor chip having the bumps 68, 69 formed on the electrodes 63a, 63c is provided (FIG. 9E). The bumps 68, 69 each have a height of 20 ìm, for example.

Figure 10:
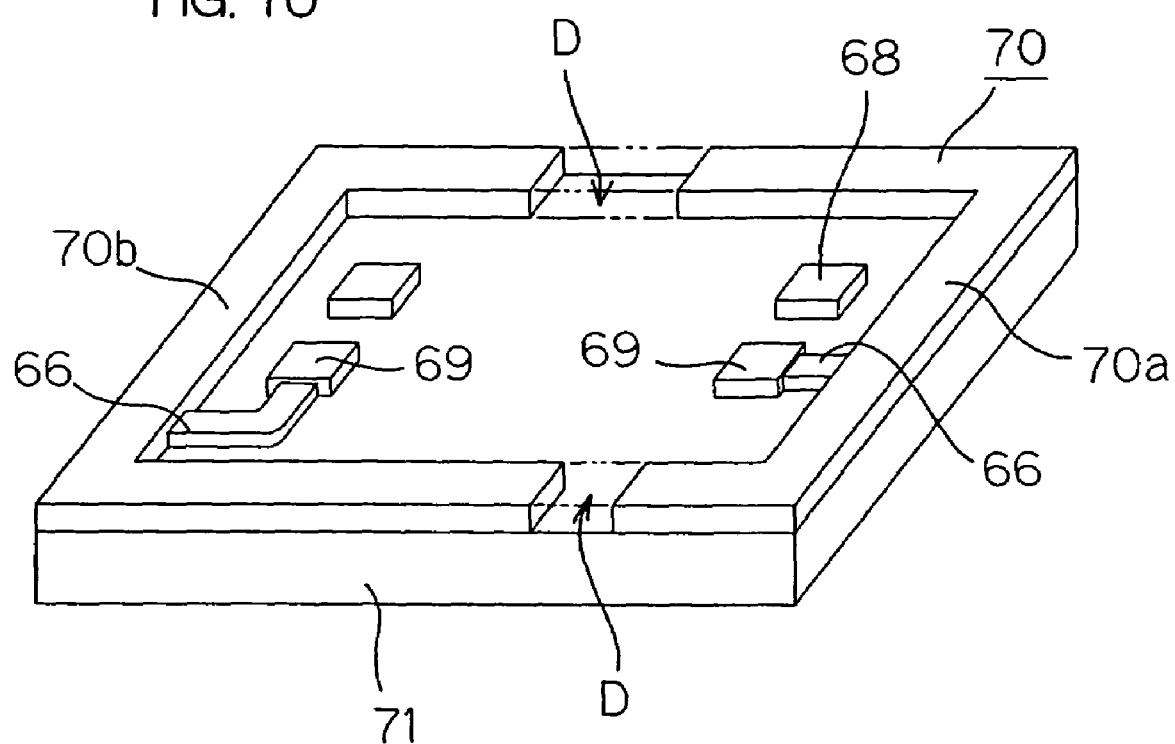
FIG. 10 is a perspective view illustrating major portions of a semiconductor chip according to further another embodiment of the invention.

FIG. 10 is a perspective view illustrating further another embodiment of the invention. In FIG. 10, components corresponding to those illustrated in FIG. 7 are denoted by the same reference characters as in FIG. 7.

Figure 11:
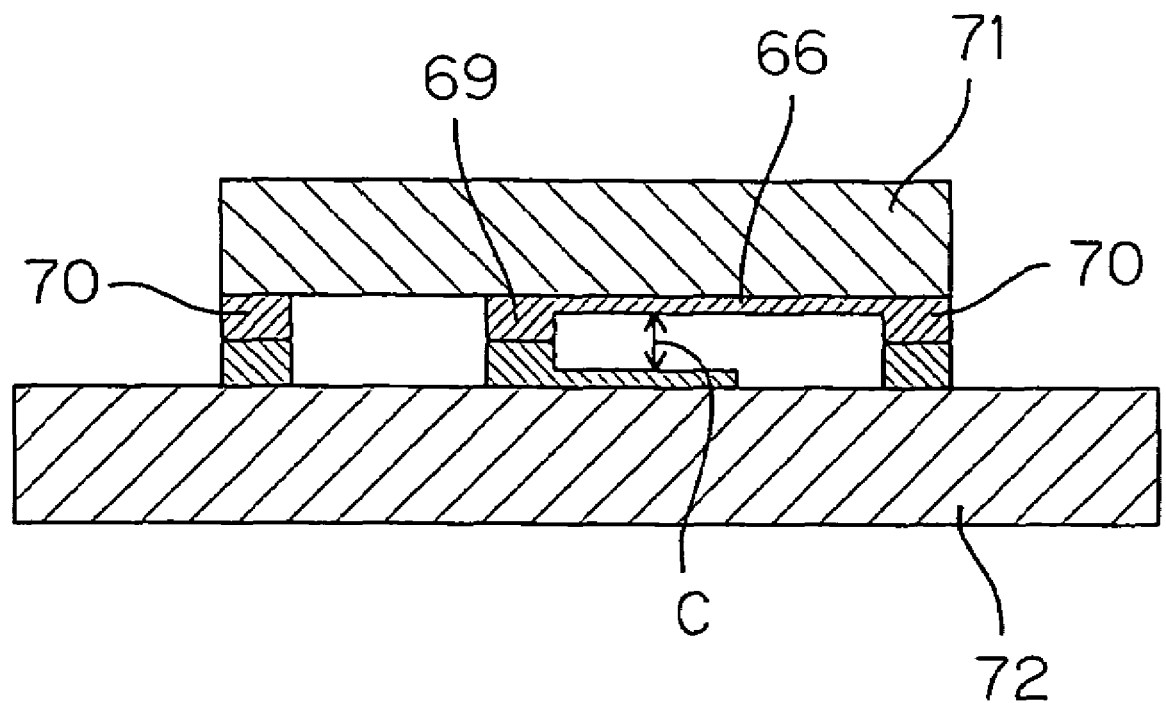
FIG. 11 is a sectional view illustrating a double-chip structure of so-called chip-on-chip type which includes a pair of semiconductor chips.

In this embodiment, bumps 68, 69 are provided on an upper surface of a semiconductor chip 71, and a bump 70a for grounding and a bump 70b for power supply (which is generally referred to as "peripheral bump 70") are provided on a peripheral portion of the semiconductor chip 71. Further, surface interconnections 66 are provided to respectively connect the bumps 69 to the peripheral bumps 70a, 70b.

Where one of the peripheral bumps 70a, 70b is utilized as a low-resistance grounding line of the semiconductor chip 71, the bump 69 connected to the peripheral bump can easily be grounded. Where the other of the peripheral bumps 70a, 70b is utilized as a low-resistance power supply line, the bump 69 connected to the peripheral bump can easily be connected to a power source. Since the peripheral bumps 70a and 70b are spaced by gaps D as shown in FIG. 10, the peripheral bumps 70a and 70b can be connected to the ground and a power source, respectively. The peripheral bumps 70a and 70b may be connected to each other to form an endless peripheral bump 70 as shown by two-dot-and-dashed line in FIG. 10. In this case, the endless peripheral bump 70 may be grounded or connected to a power source FIG. 11 is a sectional view illustrating a double-chip structure of so-called chip-on-chip type which employs the semiconductor chip 71 having the peripheral bump 70. With the peripheral bump 70 being bonded to an opposed peripheral bump of another semiconductor chip 72, a semiconductor device constituted by the semiconductor chips 71, 72 has a perfect shielding structure (particularly when the bump 70 is endless) and, hence, is highly resistant to electrostatic induction. Further, the peripheral bumps 70 alleviates a stress exerted on the semiconductor chips at or after the mounting thereof.

In the case of the semiconductor device shown in FIG. 11, the surface interconnection 66 has a smaller height than the bump 69 and the peripheral bump 70. Therefore, when the two semiconductor chips 71 and 72 are bonded to each other in a chip-on-chip relation, a predetermined clearance C can be provided between the surface interconnection 66 and an opposed surface interconnection of the semiconductor chip 72 to prevent the surface interconnection 66 from contacting the opposed surface interconnection in an unintended manner.

FIGS. 12A to 12E are sectional views for explaining a process for forming a bump and a surface interconnection. This embodiment is directed to a case where a bump on a device formation region A of a semiconductor substrate 61 is connected to a peripheral bump provided outside the device formation region (e.g., in a scribe line region B) via a surface interconnection.

Figure 12:
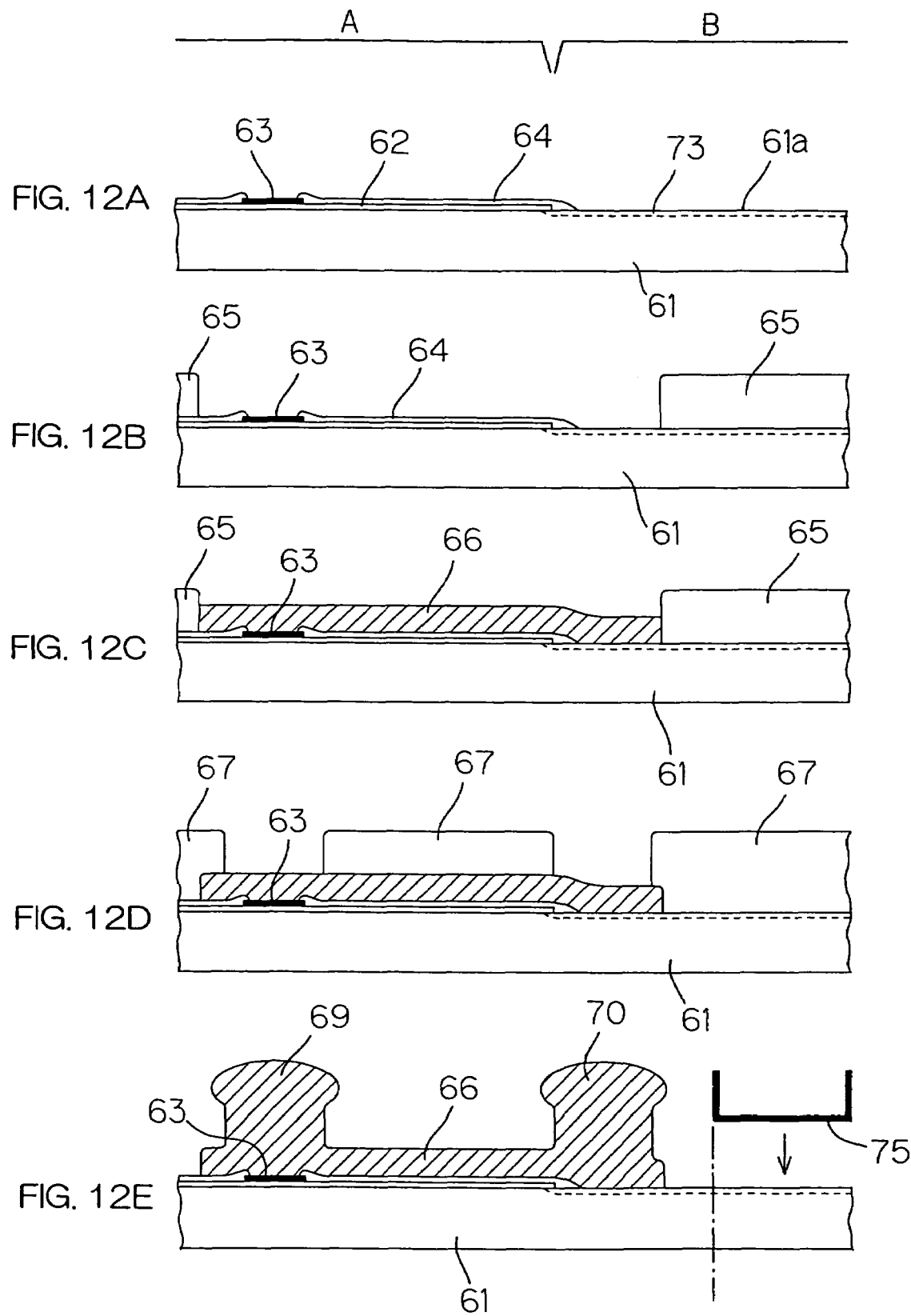
FIGS. 12A to 12E are sectional views for explaining a process for forming a bump interconnection.
Figure 13:
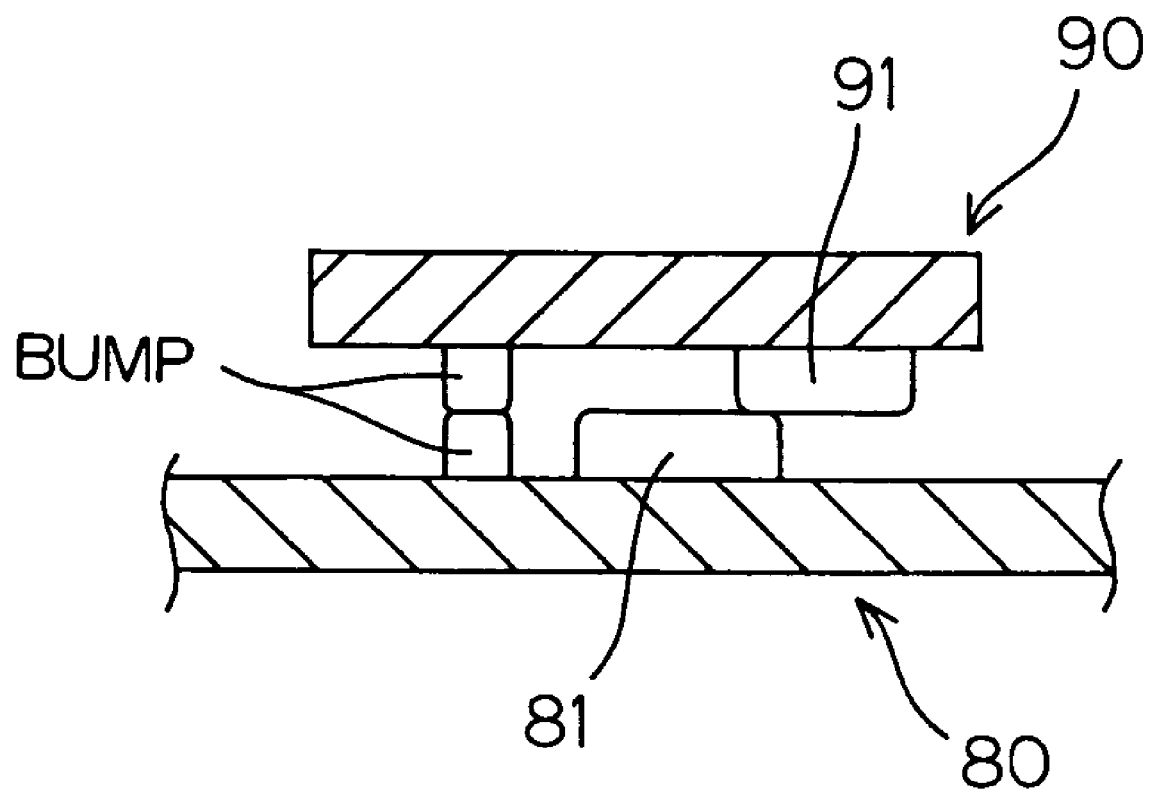
FIG. 13 is a sectional view for explaining a problem associated with a semiconductor chip having a surface interconnection.

As shown in FIG. 12A, an Al electrode 63 is provided on the device formation region A of the semiconductor substrate 61 with the intervention of an $SiO_2$ film 62. A passivation film 64 covers the $SiO_2$ film except a portion thereof covered with the Al electrode 63. The scribe line region B of the substrate is doped with an impurity 73 of a predetermined polarity at a high concentration for ohmic contact with the peripheral bump 70 or for isolation of the peripheral bump 70. For the ohmic contact, the impurity has the same polarity as the substrate. For the isolation, the impurity has a different polarity from the substrate.

A TiW alloy layer (barrier metal layer) for improving adhesion between the Al electrode and the bump and a seed layer (not shown) such as of Au or Pt for power supply are formed on the device formation region A and the scribe line region B by vapor deposition such as sputtering.

In turn, a photoresist 65 is applied onto the resulting surface as uncovering a portion thereof on which the surface interconnection is to be formed in the device formation region A and the scribe line region B by plating (FIG. 12B).

Then, a metal material 66 for the surface interconnection is thinly deposited on the uncovered portion by electroplating or electroless plating (FIG. 12C). Examples of the metal material for the surface interconnection include oxidation-resistant metals such as Au, Pd, Pt, Ag and Ir (iridium).

Subsequently, the photoresist 65 is removed, and another photoresist 67 is applied onto the resulting surface so as to uncover portions thereof on which the bumps 69, 70 are to be formed around the electrode 63 and in the scribe line region (FIG. 12D).

Then, a metal material for the bumps is thickly deposited on the resulting surface by electroplating which utilizes the seed layer. After the photoresist 67 is removed, an exposed portion of a laminate of the seed layer and the barrier metal layer is removed, and then the resulting surface is subjected to an annealing process. Thus, the semiconductor chip having the bump 69 provided on the electrode 63 and the peripheral bump 70 provided in the scribe line region is provided (FIG. 12E). Finally, the semiconductor substrate is cut along a scribe line in the scribe line region B by means of a cutter 75.

In the semiconductor chip production processes according to the embodiments explained with reference to FIGS. 7 and 10, the formation of the bumps and the surface interconnection having different heights may be achieved in substantially the same manner as the methods (FIGS. 2A to 2F, FIGS. 3A to 3D, FIGS. 4A to 4D, FIG. 5 and FIG. 6) described for the embodiment of FIG. 1.

Although the primary chip and the secondary chip are each comprised of a silicon chip in the embodiments described above, any other semiconductor chips such as of compound semiconductors (e.g., gallium arsenide semiconductor) and a germanium semiconductor may be employed. In this case, the primary chip and the secondary chip may be composed of the same semiconductor material or different semiconductor materials.

The aforesaid embodiments are directed to the chip-on-chip structure, but the semiconductor chip according to the present invention is applicable to a flip-chip-bonded structure in which the semiconductor chip is bonded on a printed wiring board with its face opposed to the printed wiring board.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application claims priority benefits under 35 USC Section 119 on the basis of Japanese Patent Application No. 11-40399 filed to the Japanese Patent Office on Feb. 18, 1999 and Japanese Patent Application No. 11-45211 filed to the Japanese Patent Office on Feb. 23, 1999, the disclosure thereof being incorporated herein by reference.

What is claimed is:

1. A production process for a semiconductor chip, comprising the steps of:
   providing a first internal interconnection and a second internal interconnection on a semiconductor substrate;
   forming a surface protective film over the internal interconnections;
   forming a first opening and a second opening in the surface protective film to respectively expose a portion of the first internal interconnection and a portion of the second internal interconnection;
   forming a bump projecting from the surface protective film on the portion of the first internal interconnection exposed through the first opening, the bump having a side surface; and
   forming, after the formation of the bump or simultaneously with the formation of a part of the bump, a surface interconnection that entirely covers the portion of the second internal interconnection exposed through the second opening and that extends to the side surface of the bump to electrically connect the bump to the second internal connection, the surface interconnection having a smaller height than the bump.

2. A process as set forth in claim 1,
   wherein the bump forming step includes the step of selectively depositing a conductive material on the portion of the first internal interconnection exposed through the first opening,
   wherein the surface interconnection forming step includes the step of selectively depositing a conductive material in a predetermined region on the surface protective film.

3. A process as set forth in claim 1,
   wherein the conductive material is selectively deposited on the portion of the first internal interconnection exposed through the first opening and in a predetermined region on the surface protective film, thereby to form a part of the bump and the surface interconnection,
   wherein the conductive material is further selectively deposited on the part of the bump to complete the bump which projects from the surface protective film.

4. A process as set forth in claim 1, further comprising the step of forming a recess in a region of the surface protective film on which the surface interconnection is to be formed before the formation of the bump and the surface interconnection, wherein the surface interconnection is formed in the recess.

5. A process as set forth in claim 4,
   wherein the conductive material is selectively deposited in the first opening and the recess to form the part of the bump and the surface interconnection,
   wherein the conductive material is further selectively deposited on the part of the bump to complete the bump which projects from the surface protective film.

6. A process as set forth in claim 5, wherein the selective deposition of the conductive material in the first opening and the recess includes the steps of:

forming a conductive material film over the surface protective film having the first opening and the recess; and removing the conductive material film except portions thereof in the first opening and the recess.

7. A process as set forth in claim 6, wherein the removal of the conductive material film includes the step of partly polishing away the conductive material film except the portions thereof in the first opening and the recess for planarization thereof.

8. A process as set forth in claim 6, wherein the removal of the conductive material film includes the step of entirely polishing away the conductive material film except the portions thereof in the first opening and the recess for planarization thereof.

9. A process as set forth in claim 4, wherein the recess has a bottom surface located at a lower level than a top surface of the internal interconnection.

10. A process as set forth in claim 4, further comprising the step of planarizing a surface of the surface protective film after forming the surface protective film and before forming the first opening and the recess.

11. A process as set forth in claim 1, wherein the bump includes a peripheral bump to be provided outside a device formation region of a semiconductor substrate which is a base body of the semiconductor chip.

12. A process as set forth in claim 11, wherein the peripheral bump is configured as surrounding the device formation region.

13. A process as set forth in claim 11, wherein the peripheral bump is formed in a scribe line region.

14. A process as set forth in claim 11, wherein the surface interconnection is formed to be connected to the peripheral bump.

15. A process as set forth in claim 1, wherein the step of forming a surface interconnection comprises electroplating with material for the surface interconnection.

16. A process as set forth in claim 1, wherein the step of forming a surface interconnection is conducted so that the surface interconnection has a substantially uniform thickness.

* * * * *